US008062953B2

(12) United States Patent
Hall et al.

(10) Patent No.: US 8,062,953 B2
(45) Date of Patent: Nov. 22, 2011

(54) SEMICONDUCTOR DEVICES WITH EXTENDED ACTIVE REGIONS

(75) Inventors: Mark D. Hall, Austin, TX (US); Glenn C. Abeln, Buda, TX (US); Chong-Cheng Fu, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 520 days.

(21) Appl. No.: 12/182,421

(22) Filed: Jul. 30, 2008

(65) Prior Publication Data
US 2010/0025805 A1    Feb. 4, 2010

(51) Int. Cl.
*H01L 21/76* (2006.01)
(52) U.S. Cl. .................. 438/429; 257/E21.56; 438/296; 438/430
(58) Field of Classification Search .................. 438/296, 438/429, 430; 257/E21.56
See application file for complete search history.

(56) References Cited

U.S. PATENT DOCUMENTS

| 6,483,156 | B1 | 11/2002 | Adkisson et al. |
| 6,503,799 | B2 * | 1/2003 | Horita et al. .................. 438/269 |
| 6,660,596 | B2 | 12/2003 | Adkisson et al. |
| 6,716,571 | B2 * | 4/2004 | Gabriel et al. ................ 430/313 |
| 2002/0160320 | A1 | 10/2002 | Shields et al. |
| 2008/0079076 | A1 * | 4/2008 | Sheen et al. .................. 257/349 |

FOREIGN PATENT DOCUMENTS
KR    10-2005-0045599 A    5/2005

OTHER PUBLICATIONS

International Application No. PCT/US2009/043457, International Search Report and Written Opinion dated Dec. 29, 2009.

* cited by examiner

*Primary Examiner* — Bradley K Smith
*Assistant Examiner* — Amar Movva
(74) *Attorney, Agent, or Firm* — Charles Bergere

(57) ABSTRACT

A method of making a semiconductor device is achieved in and over a semiconductor layer. A trench is formed adjacent to a first active area. The trench is filled with insulating material. A masking feature is formed over a center portion of the trench to expose a first side of the trench between a first side of the masking feature and the first active area. A step of etching into the first side of the trench leaves a first recess in the trench. A first epitaxial region is grown in the first recess to extend the first active area to include the first recess and thereby form an extended first active region.

17 Claims, 6 Drawing Sheets

SEMICONDUCTOR DEVICES WITH EXTENDED ACTIVE REGIONS

BACKGROUND

1. Field

This disclosure relates generally to semiconductor processing, and more specifically, to forming semiconductor devices having extended active regions.

2. Related Art

Semiconductor processing technologies typically impose various dimensional constraints related to active spaces and active widths. For example, a representative 90 nm node CMOS technology may allow a minimum active space of 140 nm and a minimum active width of 110 nm. Typically, such dimensional constraints are imposed to allow manufacturing tolerances during semiconductor processing and to ensure adequate device isolation. In particular, imposing such dimensional constraints may result in easier patterning of active regions and the subsequent filling of the gaps created by shallow trenches.

Such dimensional constraints, however, reduce design flexibility. For example, in certain instances wider active regions are desired to increase drive current, but cannot be implemented because of the rigid dimensional constraints imposed by conventional design and process methodologies. As an example, in the SRAM cells wider active regions can only be achieved at the cost of an increase in the cell size. Accordingly, there is a need for forming semiconductor devices having extended active regions while substantially complying with the dimensional constraints imposed by design rules related to a particular semiconductor processing technology.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

By way of an example, in the same integrated circuit, active areas with different widths can be formed, where both types of active areas are at the minimum allowed pitch. This allows increased design flexibility by allowing the option to have standard drive current devices and higher drive current devices in the same integrated circuit. In one aspect, a method of forming a semiconductor device is provided. The method includes forming a trench adjacent to a first active area. The method further includes filling the trench with insulating material. The method further includes forming a masking feature over a center portion of the trench to expose a first side of the trench between a first side of the masking feature and the first active area. The method further includes etching into the first side of the trench to leave a first recess in the trench. The method further includes growing a first epitaxial region in the first recess to extend the first active area to include the first recess and thereby form an extended first active region.

In another aspect, a method of forming a semiconductor device is provided. The method includes providing a semiconductor substrate. The method further includes forming a trench around an active region that defines a boundary of the active region. The method further includes filling the trench with insulating material to form an isolation region. The method further includes forming a masking feature over the isolation region, wherein the masking feature has an edge spaced from the active region to provide an exposed region of the isolation region between the edge of the masking feature and the active region. The method further includes etching into the exposed region to form a recess. The method further includes filling the recess with semiconductor material to form an extended active region as a combination of the recess filled with semiconductor material and the active region.

In yet another aspect, a semiconductor device is provided. The semiconductor device includes a semiconductor structure having a top surface. The semiconductor device further includes an isolation region of insulating material extending from the top surface to a first depth. The semiconductor device further includes an active region of semiconductor material having a central portion and an adjacent portion, wherein: (1) the central portion extends from the top surface to at least the first depth; (2) the adjacent portion has top portion at the top surface and a bottom portion at no more than a second depth; (3) the second depth is less than the first depth; (4) the adjacent portion is between the central portion and isolation region from the top portion to the bottom portion; and (5) the isolation region is directly under the bottom portion of the adjacent portion.

Figure 1:
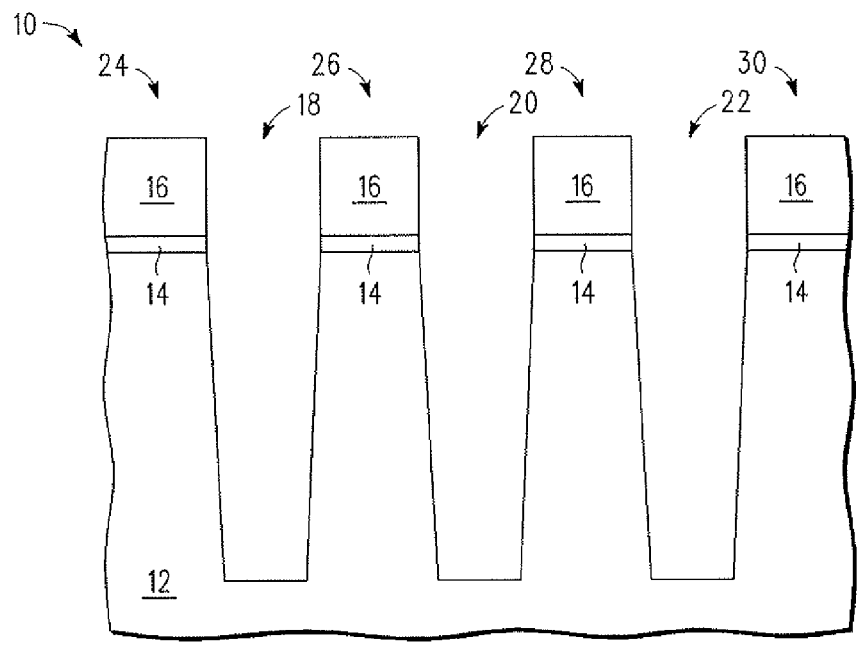
FIG. 1 is a cross-sectional view of a semiconductor device during a processing step.

FIG. 1 is a cross-sectional view of a semiconductor device 10 during a processing step. Semiconductor device 10 may be formed using a semiconductor substrate 12 using conventional semiconductor processing equipment. Semiconductor substrate 12 described herein can be any semiconductor material or combinations of materials, such as gallium arsenide, silicon germanium, silicon-on-insulator (SOI), silicon, monocrystalline silicon, the like, and combinations of the above. Although an embodiment of the present invention is described using a bulk silicon substrate, other types of substrate, including SOI could also be used consistent with the present invention. A layer of pad oxide 14 may be grown over a top surface of substrate 12. By way of example, the pad oxide layer may be 5 nm to 25 nm thick. Next, a nitride layer 16 may be deposited over the layer of pad oxide. By way of example, the nitride layer may be 50 nm to 200 nm thick. Next, using semiconductor processing techniques, active regions 24, 26, 28, and 30 may be formed, such that these active regions are separated by trenches 18, 20, and 22, respectively.

Figure 2:
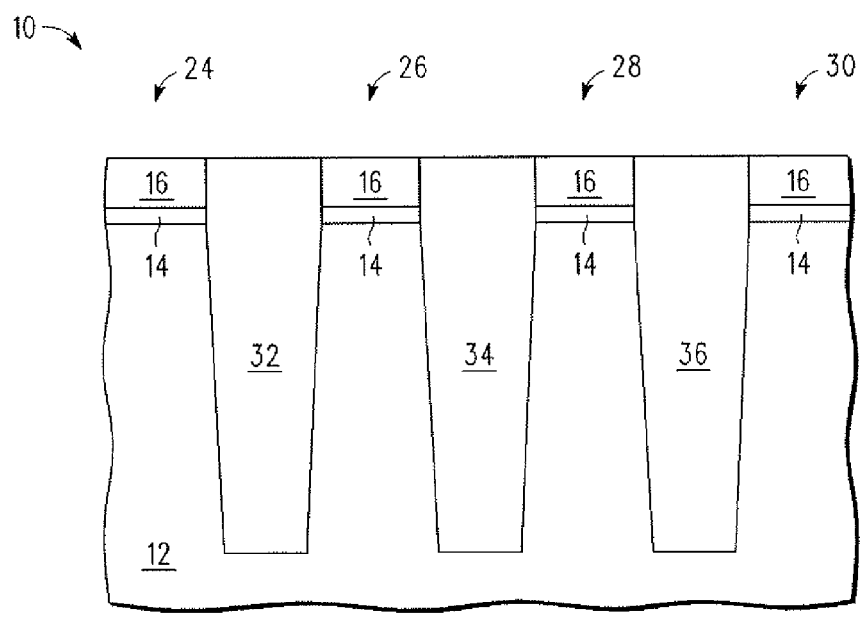
FIG. 2 is a cross-sectional view of a semiconductor device during a processing step.

Referring now to FIG. 2, trenches 18, 20, and 22 may be filled using an insulating material to form shallow trench isolation regions 32, 34, and 36. Next, the top surface of the shallow trench isolation regions may be planarized using chemical-mechanical polishing, for example.

Figure 3:
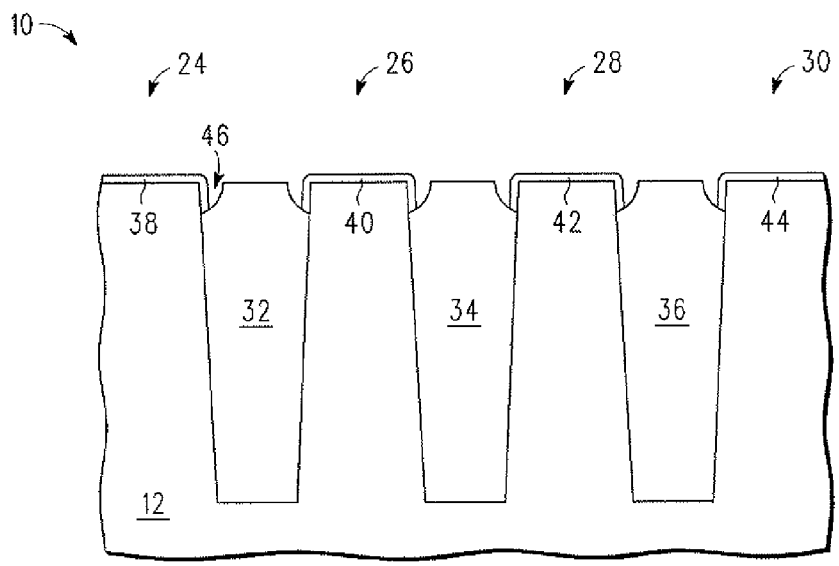
FIG. 3 is a cross-sectional view of a semiconductor device during a processing step.
Figure 4:
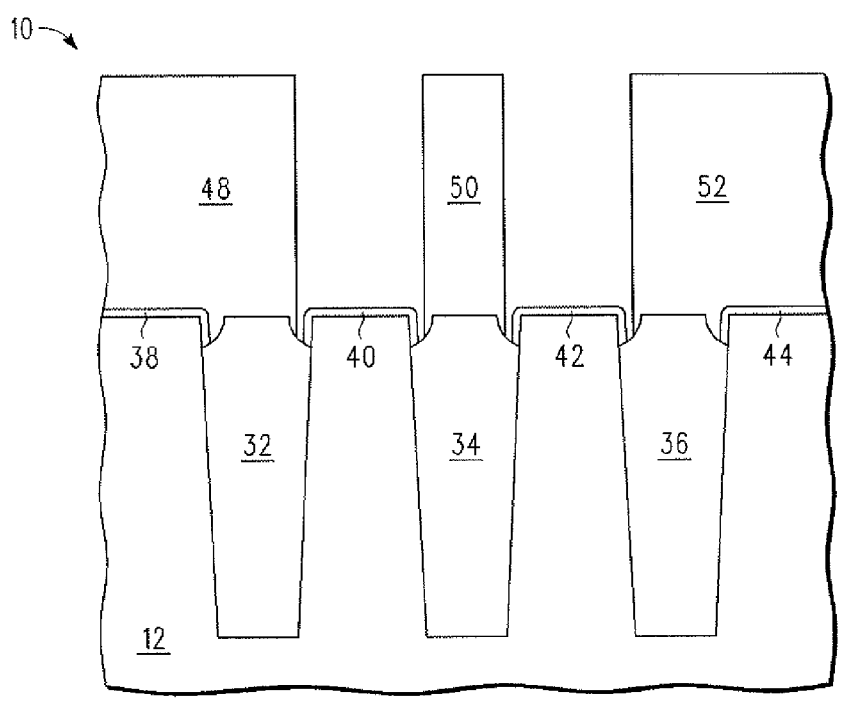
FIG. 4 is a cross-sectional view of a semiconductor device during a processing step.
Figure 5:
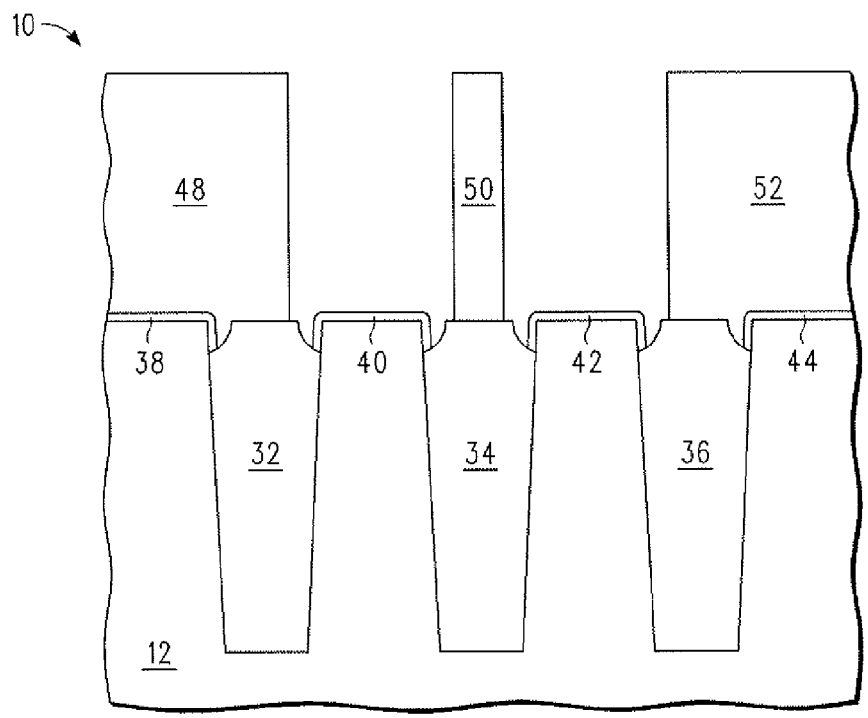
FIG. 5 is a cross-sectional view of a semiconductor device during a processing step.

Referring now to FIG. 3, nitride layer 16 may be removed from active regions 24, 26, 28 and 30 using a wet phosphoric etch, for example. Next, pad oxide layer 14 may be removed using a hydrofluoric etch, for example. As shown in FIG. 3, trench divots, such as a trench divot 46 may be formed as a result of the removal of the pad oxide layer. Next, sacrificial oxide layers 38, 40, 42, and 44 may be grown. Next, as shown in FIG. 4, a patterned photoresist layer including photoresist sections 48, 50, and 52 may be formed. With reference to FIG. 5, photoresist sections 48, 50, and 52 (also referred to as masking features) may be trimmed prior to etching. By way of example, trimming may include ashing. As an example, masking feature 50, formed over shallow trench isolation region 34, may leave exposed regions on both sides. Each exposed region may be between the edge of masking feature 50 and the corresponding active region.

Figure 6:
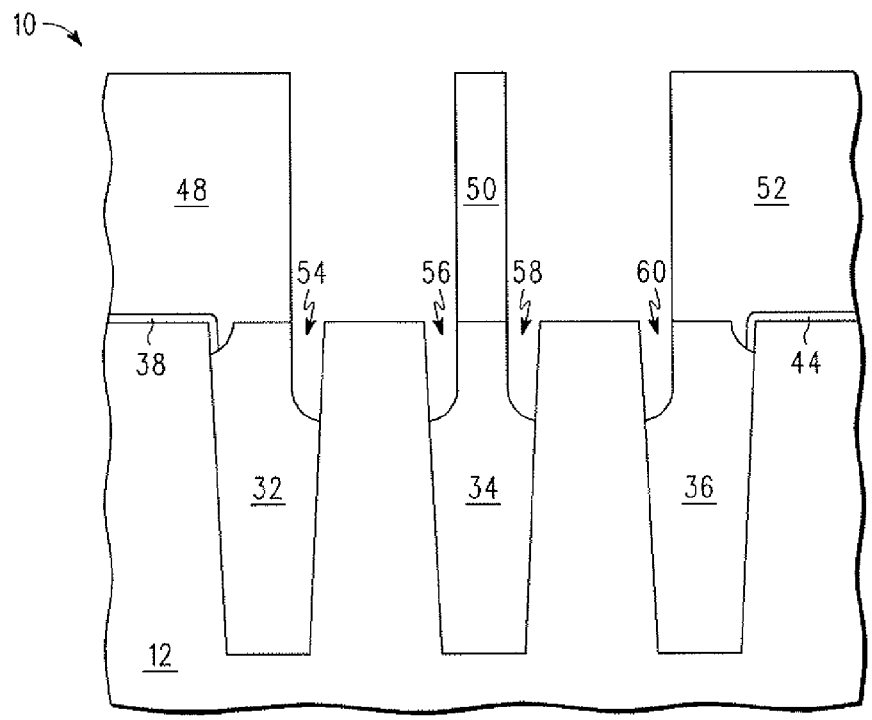
FIG. 6 is a cross-sectional view of a semiconductor device during a processing step.
Figure 7:
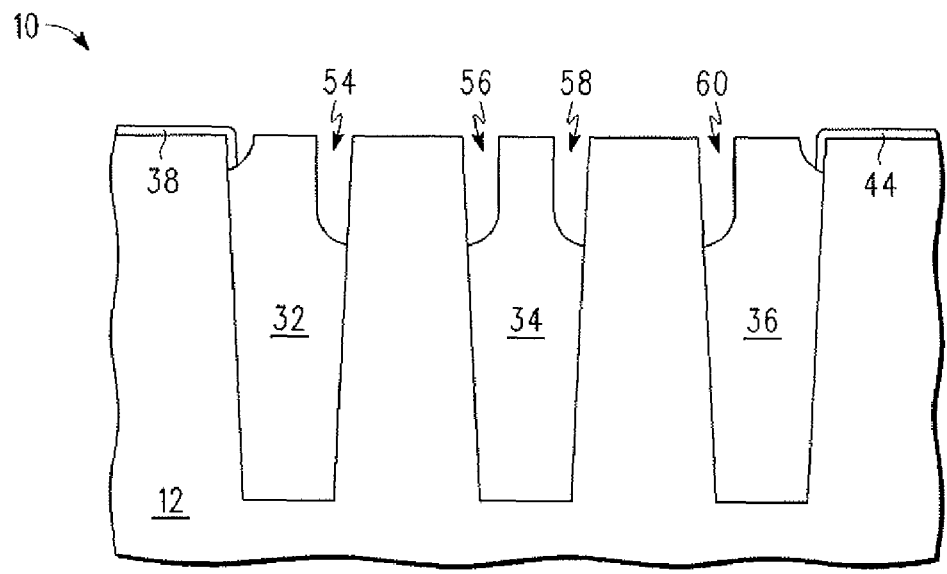
FIG. 7 is a cross-sectional view of a semiconductor device during a processing step.

Referring now to FIG. 6, sacrificial oxide layers 38, 40, 42, and 44 and a portion of the oxide in trench isolation regions 32, 34, and 36 may be removed creating recesses 54, 56, 58, and 60. By way of example, an isotropic dry etch using hydrofluoric acid (HF) or an anisotropic oxide dry etch may be used as part of this step. In one embodiment, the depth of the recesses may be 30 nm to 100 nm. Next, as shown in FIG. 7, photoresist sections 48, 50, and 52 may be removed.

Figure 8:
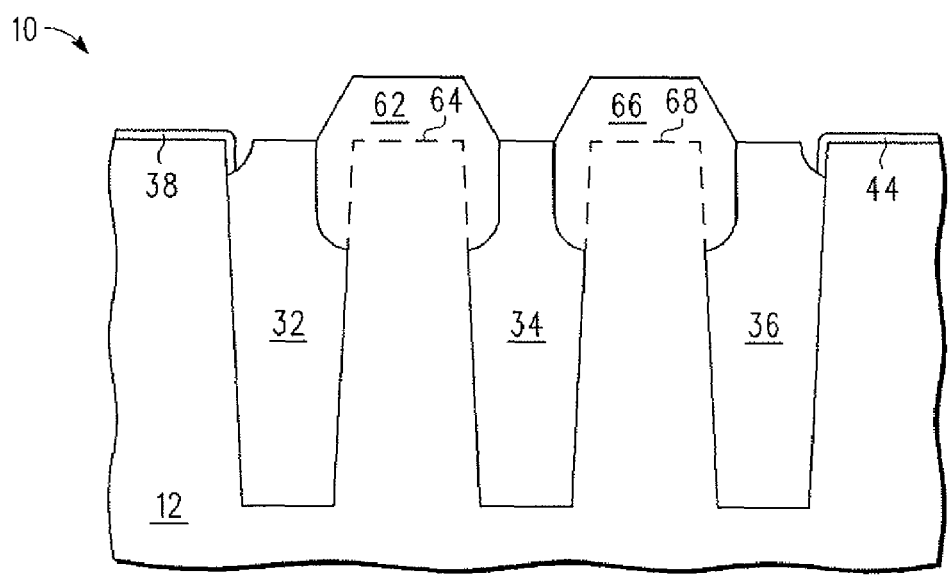
FIG. 8 is a cross-sectional view of a semiconductor device during a processing step.

Referring now to FIG. 8, silicon may be epitaxially grown to form epitaxial regions 62 and 66. This step results in selective widening of active regions. Thus, for example, the original active regions 64 and 68 are widened as a result of the grown epitaxial regions. At the same time, however, unpatterned areas are protected by sacrificial oxide layers 38 and 44, for example. Because silicon is grown epitaxially, it has the same crystal orientation as the original active silicon. Thus, using this process, selective active regions can be widened to provide more drive current, as needed. Moreover, the same shallow trench isolation regions are used to provide isolation for both widened and not-widened active regions. In other words, along with complying with dimensional constraints imposed by a technology, such as 90 nm CMOS, widened active regions can be formed. Although FIG. 8 describes the step as epitaxial growth of silicon, silicon may be provided in the recesses using other methods, as long as the provided silicon has the same crystal structure and orientation as the original silicon in the active regions.

Figure 9:
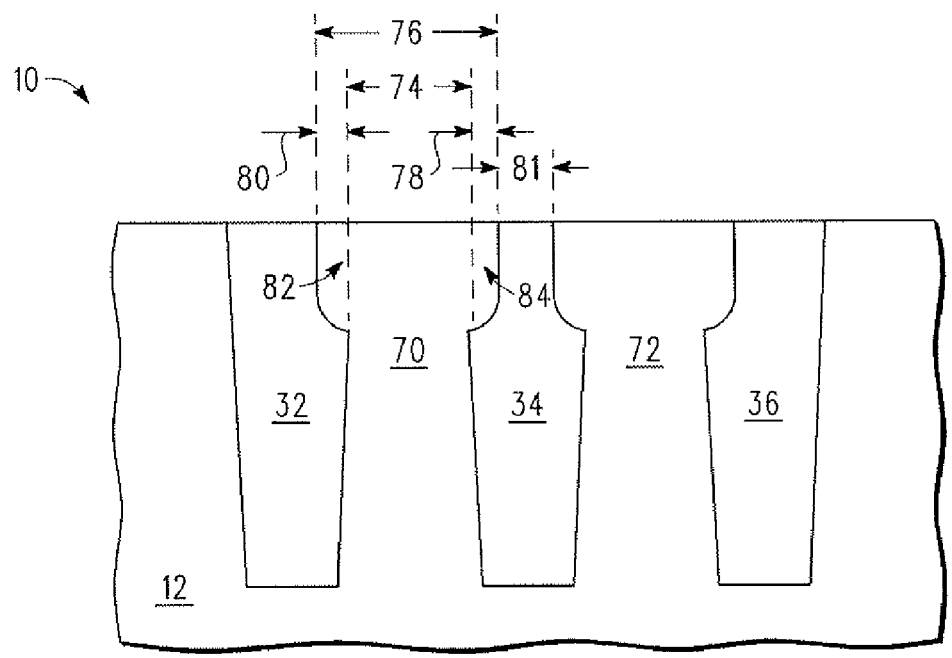
FIG. 9 is a cross-sectional view of a semiconductor device during a processing step.
Figure 10:
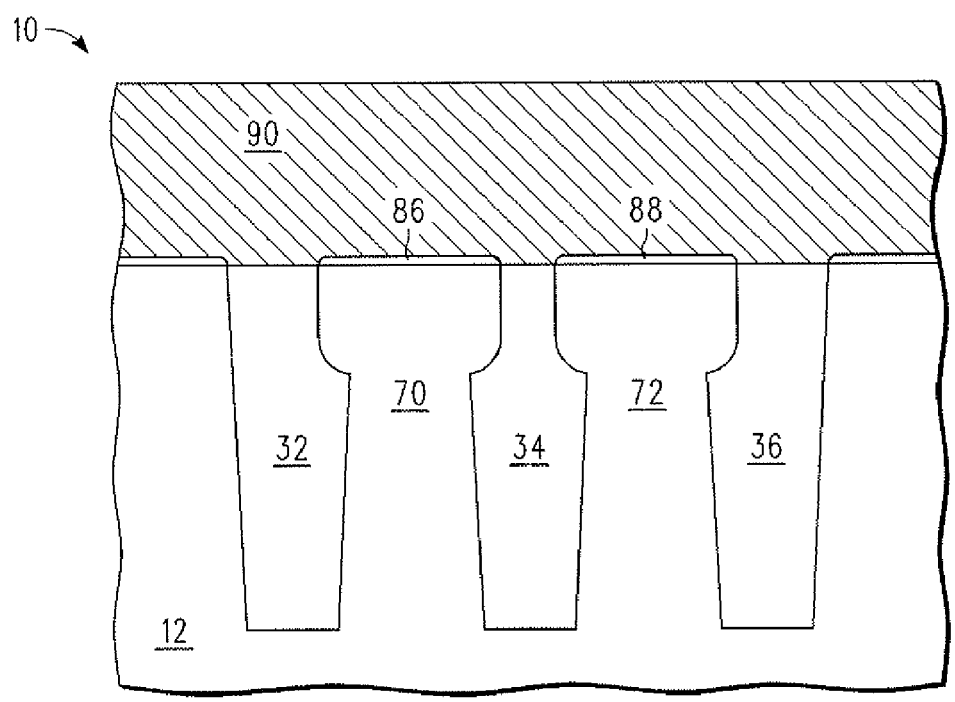
FIG. 10 is a cross-sectional view of a semiconductor device during a processing step.

Next, as shown in FIG. 9, the top surface device 10 may be polished to remove grown epitaxial regions, except the epitaxial growth formed in extended active regions 82 and 84, for example. By way of example, this step may be performed using chemical-mechanical polishing techniques. As a result of this step, active regions 70 and 72 may have a width 76 as opposed to original width 74. Specifically, extensions 78 and 80 may add to original width 74, as shown in FIG. 9. Extended active regions 82 and 84 may provide additional surface area resulting in a higher transistor drive current. The extension of active regions, however, may narrow shallow trench isolation region 34, as indicated by reference numeral 81. Next, as shown in FIG. 10, gate dielectric layers 86 and 88 may be formed over active regions 70 and 72. Moreover, a gate electrode layer 90 may be formed, as shown in FIG. 10. Additional spacers (not shown) may be formed to form transistors.

Figure 11:
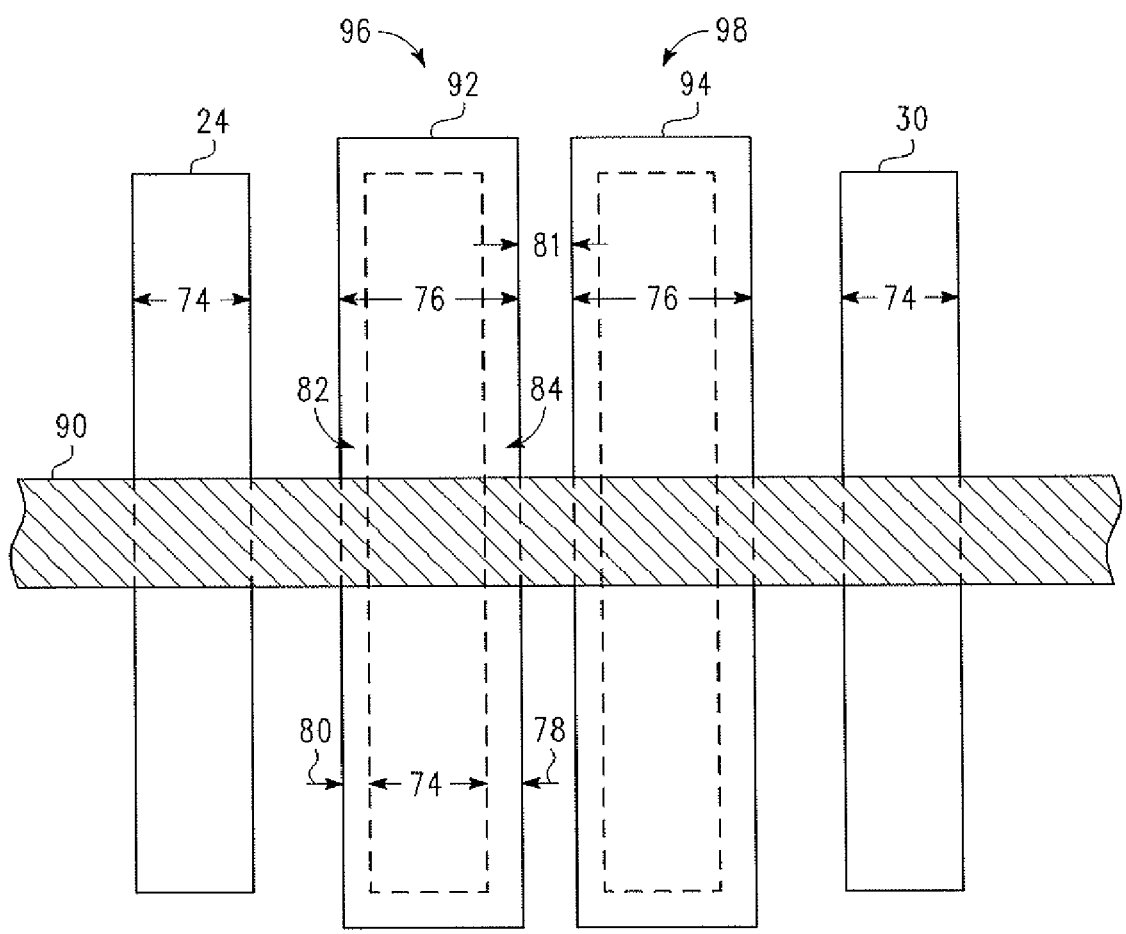
FIG. 11 is a top view of the semiconductor device of FIG. 10 during a processing step.

Referring now to FIG. 11, which shows a top view of the device 10 of FIG. 10, transistors 96 and 98 may be formed having channel widths corresponding to active regions 92 and 94, respectively, with extended width 76, as compared with original width 74. In one embodiment, semiconductor device 10 may include a semiconductor structure (substrate 12, for example) having a top surface. Isolation regions 32, 34, and 36 may extend from the top surface of substrate 12 to a certain depth. Active region 92 may have a central portion (representative of area covered by active region 74, for example) and an adjacent portion (representative of area covered by active region 84, for example). The central portion of the active region may extend at least to the same depth as the depth of isolation regions 32, 34, and 36, for example. The adjacent portion may have a top portion that has a top surface that is in the same plane as the top surface of the central portion and it may have a bottom portion at no more than a certain depth that is less than the depth to which the central portion extends. As evident from the combination of the various views, at least a portion of isolation region 32 (shown in FIG. 2, but not shown in FIG. 11) may be directly under the bottom portion of the adjacent portion.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of forming a planar semiconductor device in and over a semiconductor layer, comprising:
    forming a trench adjacent to a first active area;
    filling the trench with insulating material;
    forming a masking feature over a center portion of the trench to expose a first side of the trench between a first side of the masking feature and the first active area;
    etching into the first side of the trench to leave a first recess in the trench; and
    growing a first epitaxial region in the first recess, wherein the first epitaxial region completely fills the first recess to extend the first active area to include the first recess and thereby form an extended first active region.

2. The method of claim 1, wherein the first active area has a first width extending in a first direction, further comprising:

forming planar transistor over and in the extended first active region having a gate over a channel running in the first direction wherein the planar transistor has a channel width greater than the first width.

3. The method of claim 1, further comprising chemical mechanical polishing the extended first active area.

4. The method of claim 3, wherein the first active area has a first width extending in a first direction, further comprising:
forming, after the step of chemical mechanical polishing, a planar transistor over and in the extended first active region having a gate over a channel running in the first direction wherein the planar transistor has a channel width greater than the first width.

5. The method of claim 1 further comprising trimming the masking feature prior to the step of etching.

6. The method of claim 5, wherein the step of trimming is further characterized as comprising ashing.

7. The method of claim 1, wherein:
the step of forming a trench is further characterized by the trench being between the first active area and a second active area;
the step of forming the masking feature is further characterized as exposing a second side of the trench between a second side of the masking feature and the second active area;
the step of etching is further characterized as etching into the second side of the trench to leave a second recess in the trench; and
the step of growing is further characterized by growing a second epitaxial region in the second recess, wherein the second epitaxial region completely fills the second recess to extend the second active area to include the second recess and thereby form an extended second active region.

8. The method of claim 7, further comprising chemical mechanical polishing the extended first active area and the extended second active area.

9. The method of claim 8, further comprising:
forming a gate, after the step of chemical mechanical polishing, extending over the first extended active area and the second active area including over the first epitaxial region and the second epitaxial region.

10. The method of claim 9, wherein the step of forming the masking feature is further characterized by the masking feature comprising photoresist, the method further comprising trimming the photoresist before the step of etching.

11. A method of forming a planar semiconductor device, comprising:
providing a semiconductor substrate;
forming a trench around an active region that defines a boundary of the active region;
filling the trench with insulating material to form an isolation region;
forming a masking feature over the isolation region, wherein the masking feature has an edge spaced from the active region to provide an exposed region of the isolation region between the edge of the masking feature and the active region;
etching into the exposed region to form a recess;
filling the recess with semiconductor material, wherein the semiconductor material completely fills the recess to form an extended active region as a combination of the recess filled with semiconductor material and the active region; and
chemical mechanical polishing the extended active region.

12. The method of claim 11, further comprising:
trimming the mask feature prior to the step of etching.

13. The method of claim 11, further comprising forming a gate over the extended active region.

14. The method of claim 13, wherein the step of forming the gate is further characterized by the gate passing over the recess filled with semiconductor material.

15. The method of claim 11, wherein the step of forming the masking feature is further characterized by the exposed region extending completely around the active area.

16. The method of claim 11, further comprising:
forming a planar transistor in and over the active region, the planar transistor having a gate that crosses the recess filled with semiconductor material in two different locations.

17. The method of claim 11, wherein the step of completely filling the recess is further characterized as epitaxially growing the semiconductor material.

* * * * *